(12) United States Patent
Lo et al.

(10) Patent No.: US 10,417,964 B1
(45) Date of Patent: Sep. 17, 2019

(54) DISPLAY WITH REDUNDANCY

(71) Applicant: Apple Inc., Cupertino, CA (US)

(72) Inventors: Cheuk Chi Lo, Belmont, CA (US);
Chun-Ming Tang, San Jose, CA (US);
Chun-Yao Huang, San Jose, CA (US);
Ivan Knez, San Jose, CA (US)

(73) Assignee: Apple Inc., Cupertino, CA (US)

( * ) Notice: Subject to any disclaimer, the term of this patent is extended or adjusted under 35 U.S.C. 154(b) by 26 days.

(21) Appl. No.: 15/947,687

(22) Filed: Apr. 6, 2018

Related U.S. Application Data

(60) Provisional application No. 62/519,676, filed on Jun. 14, 2017.

(51) Int. Cl.
| | | |
|---|---|---|
| *G09G 5/00* | (2006.01) | |
| *G09G 3/3233* | (2016.01) | |
| *H01L 27/12* | (2006.01) | |
| *H01L 27/32* | (2006.01) | |
| *H01L 27/146* | (2006.01) | |

(52) U.S. Cl.
CPC ......... *G09G 3/3233* (2013.01); *H01L 27/124* (2013.01); *H01L 27/14609* (2013.01); *H01L 27/3223* (2013.01); *H01L 27/3244* (2013.01); *G09G 2330/08* (2013.01); *G09G 2330/10* (2013.01); *H01L 2251/568* (2013.01)

(58) Field of Classification Search
CPC ............. G09G 3/3233; G09G 2330/10; G09G 2330/08; G09G 2330/12; H01L 27/3244; H01L 27/3223; H01L 27/124; H01L 27/14609; H01L 2251/568
See application file for complete search history.

(56) References Cited

U.S. PATENT DOCUMENTS

| | | |
|---|---|---|
| 2014/0240304 A1 | 8/2014 | In et al. |
| 2015/0022513 A1 | 1/2015 | Kim |
| 2015/0102302 A1 | 4/2015 | Kim et al. |
| 2016/0056213 A1 | 2/2016 | Kwak et al. |
| 2017/0004763 A1 | 1/2017 | Mosier et al. |
| 2017/0169769 A1* | 6/2017 | Fletcher ............... G09G 3/3648 |
| 2018/0286300 A1* | 10/2018 | Vahid Far ............. G09G 3/006 |

* cited by examiner

*Primary Examiner* — Adam R. Giesy
(74) *Attorney, Agent, or Firm* — Treyz Law Group, P.C.; George Victor Treyz; Tianyi He

(57) ABSTRACT

A display with an array of pixels may be provided with redundant pixel control circuits. Switching circuitry may be used to couple pixel control circuits to light-emitting diodes for the pixels. The switching circuitry can be configured using control signals from non-volatile memory in decoder circuitry such as thermometer code decoder circuitry. During manufacturing, the display may be inspected for defects. Defective pixel control circuits can be replaced with redundant pixel control circuits so that the display operates satisfactory. The decoder circuitry may supply control signals to the switching circuitry to switch redundant pixel control circuitry into use while bypassing defective pixel control circuits.

20 Claims, 7 Drawing Sheets

DISPLAY WITH REDUNDANCY

This application claims the benefit of provisional patent application No. 62/519,676, filed on Jun. 14, 2017, which is hereby incorporated by reference herein in its entirety.

BACKGROUND

This relates generally to electronic devices and, more particularly, to electronic devices with displays.

Electronic devices often include displays. Displays include arrays of individually adjustable pixels for producing images. Displays may include hundreds or thousands of rows and columns of pixels. Due to the relatively large number of pixels in a display, it is possible for a pixel circuit in a display to contain a manufacturing fault. This can lead to undesirable visual artifacts in a display.

SUMMARY

An electronic device may be provided with a display. The display may have an array of pixels for displaying images. The pixel array may be provided with redundant pixel control circuits that can be switched into use to overcome manufacturing defects.

Switching circuitry may be used to couple pixel control circuits including the redundant pixel control circuits to light-emitting diodes for the pixels. The switching circuitry can be configured using control signals from non-volatile memory in decoder circuitry such as a thermometer code decoder circuit.

During manufacturing, the display may be inspected for defects. Defective pixel control circuits can be replaced with redundant pixel control circuits so that the display operates satisfactory. When a defect is detected, corrective thermometer code configuration data may be loaded into the non-volatile memory of the decoder circuitry. During operation, the decoder circuitry may supply control signals to the switching circuitry based on the loaded configuration data. The control signals configure the switching circuitry to switch redundant pixel control circuitry into use while bypassing defective pixel control circuits.

DETAILED DESCRIPTION

Figure 1:
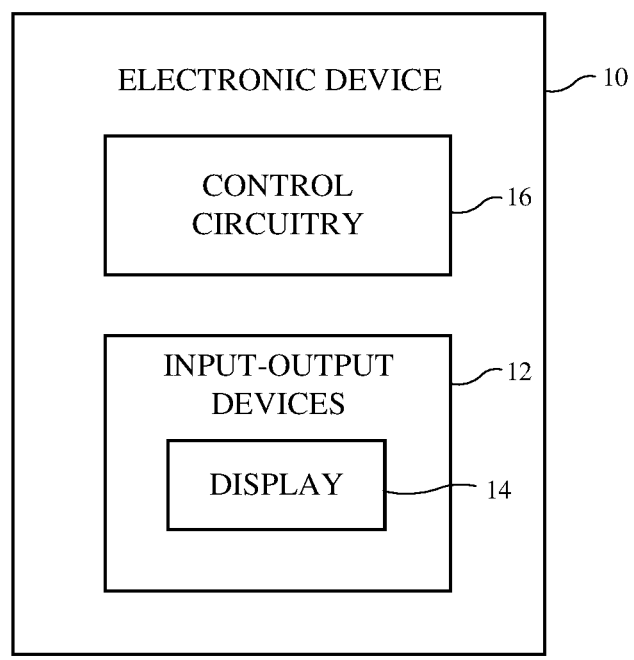
FIG. 1 is a diagram of an illustrative electronic device having a display in accordance with an embodiment.

An illustrative electronic device of the type that may be provided with a display having redundant circuitry is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a head-mounted device such as virtual reality or mixed reality equipment (e.g., glasses, googles, a helmet, etc.), or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted).

Control circuitry 16 may be used to run software on device 10 such as operating system code and applications. During operation of device 10, the software running on control circuitry 16 may display images on display 14.

Display 14 may be any suitable type of display (e.g., a liquid crystal display, an electrophoretic display, a micro-electromechanical systems display, an organic light-emitting diode display, a display having an array of light-emitting diodes formed from respective crystalline semiconductor dies, etc.). With one illustrative configuration, which may sometimes be described herein as an example, display 14 may be a light-emitting diode display having an array of light-emitting diode pixels (e.g., organic light-emitting diode pixels each having an organic light-emitting diode, pixels formed from light-emitting diodes on respective crystalline semiconductor dies, etc.).

Figure 2:
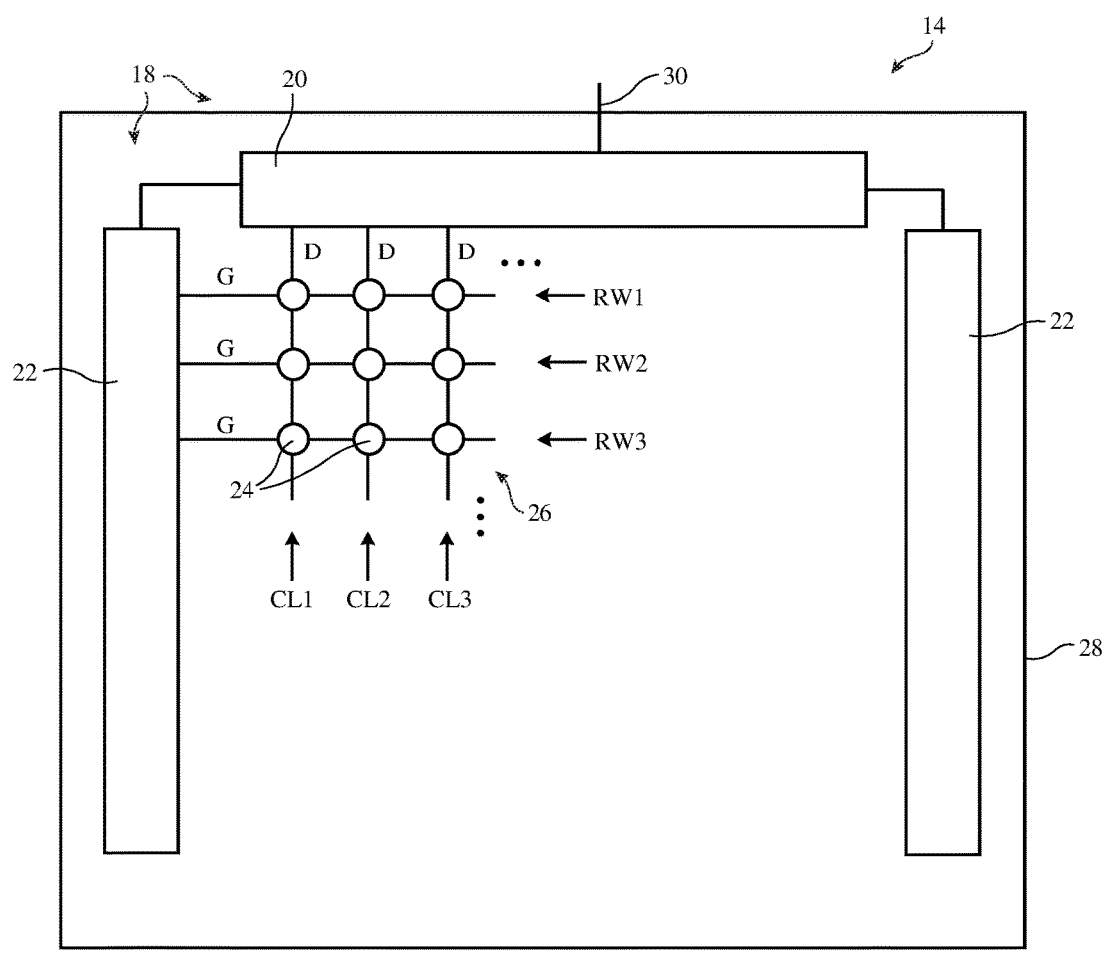
FIG. 2 is a diagram of an illustrative display in accordance with an embodiment.

A schematic diagram of an illustrative display is shown in FIG. 2. As shown in FIG. 2, display 14 may include layers such as substrate layer 28. Substrate 28 and, if desired, other layers in display 14, may be formed from layers of material such as glass layers, polymer layers (e.g., flexible sheets of polyimide or other flexible polymers), etc. Substrate 28 may be planar and/or may have one or more curved portions. Substrate 28 may have a rectangular shape with left and right vertical edges and upper and lower horizontal edges or may have a non-rectangular shape. If desired, substrate 28 may be formed from a semiconductor. For example, substrate 28 may be a silicon substrate (e.g., a crystalline silicon layer such as a crystalline silicon die). In this type of configuration, display driver circuitry, pixel control circuits, switching circuitry, and other control circuitry for display 14 may be formed from transistors and other circuitry in substrate 28.

Display 14 may have an array of pixels 24. Each pixel 24 may have a light-emitting diode such as an organic light-emitting diode or a light-emitting diode formed from a crystalline semiconductor die (sometimes referred to as a micro-light-emitting diode). Pixels 24 of pixel array 26 may be organized in rows of pixels 24 (e.g., rows RW1, RW2, RW3 . . . ) and columns of pixels 24 (e.g., columns CL1, CL2, and CL3 . . . ). There may be any suitable number of rows and columns in the array of pixels 24 (e.g., ten or more, one hundred or more, or one thousand or more). Display 14 may include pixels 24 of different colors. As an example, display 14 may include red pixels that emit red light, green pixels that emit green light, and blue pixels that emit blue light. Configurations for display 14 that include pixels of other colors may be used, if desired. Pixel array 26 forms an active area of display 14 that displays images for a user. Inactive regions may border pixel array 26. Circuitry such as display driver circuitry 18 may be located in the inactive regions.

Display driver circuitry 18 may include thin-film transistor circuitry (e.g., thin-film transistor circuits formed on substrate 28) and/or may include one or more integrated circuits mounted to substrate 28 and/or coupled to substrate 28 through one or more additional substrates. Signal paths such as signal path 30 may couple display driver circuitry 18 to control circuitry 16.

During operation, the control circuitry of device 10 (e.g., control circuitry 16 of FIG. 1) may supply circuitry such as display driver circuitry 18 with information on images to be displayed on display 14. To display the images on display pixels 24, display driver circuitry 20 may supply corresponding image data to data lines D while issuing clock signals and other control signals to supporting display driver circuitry such as gate driver circuitry 22. Gate driver circuitry 22 may produce gate line signals (sometimes referred to as scan signals, emission enable signals, etc.) or other control signals for pixels 22. The gate line signals may be conveyed to pixels 24 using control signal lines such as gate lines G. There may be one or more gate lines per row of pixels 24. Display driver circuitry such as gate driver circuitry 22 may be located along the edges of display 14 (e.g., along the left and/or right edges of display 14 as shown in FIG. 2) or elsewhere in display 14. Display driver circuitry such as display driver circuitry 20 may be located above and/or below pixel array 26 or elsewhere in display 14. The configuration of FIG. 2 is merely illustrative.

Display driver circuitry 20 may supply data signals onto a plurality of corresponding data lines D while display driver circuitry such as gate line driver circuitry 22 issues control signals on gate lines G. With the illustrative arrangement of FIG. 2, data lines D run vertically through display 14 and are associated with respective columns of pixels 24, whereas gate lines G (sometimes referred to as scan lines, emission lines, horizontal control lines, etc.) run horizontally through display 14. There may be one gate line G or multiple gate lines G associated with each row of pixels 24.

During operation, gate driver circuitry 22 may assert gate line signals on the gate lines G in display 14 in a predetermined pattern. For example, gate driver circuitry 22 may receive clock signals and other control signals from display driver circuitry 20 and may, in response to the received signals, use gate lines G to load rows of pixels 24 in sequence from data lines D. In this way, control circuitry in device 10 such as display driver circuitry 18 may provide pixels 24 with signals that direct light-emitting diodes in pixels 24 to generate light for displaying a desired image on display 14.

Figure 3:
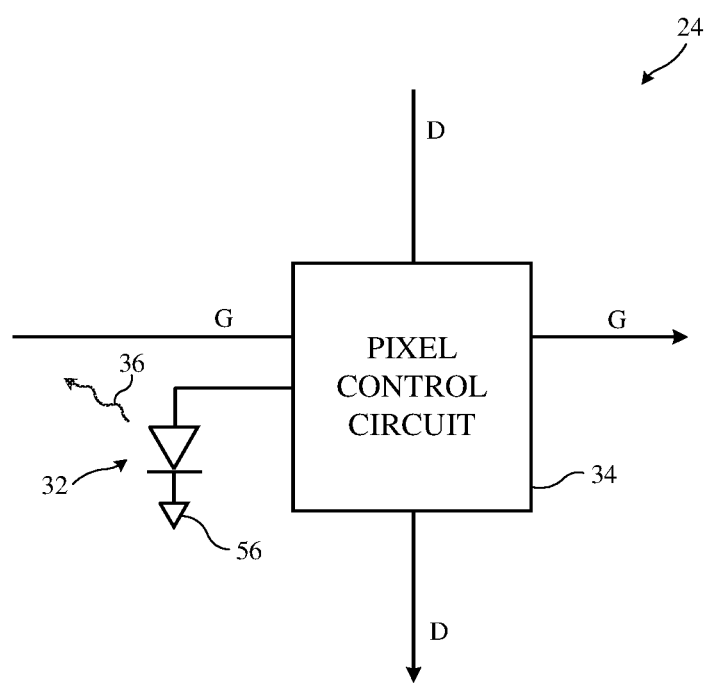
FIG. 3 is a diagram of an illustrative pixel circuit for a light-emitting diode display in accordance with an embodiment.

FIG. 3 is a diagram of an illustrative pixel circuit for pixel 24. As shown in FIG. 3, pixel 24 may include light-emitting diode 32 and associated pixel control circuit 34. In the illustrative configuration of FIG. 3, the cathode of diode 32 is coupled to node 56 (e.g., ground) and the anode of diode 32 is coupled to pixel control circuit 34. Other configurations for coupling diode 32 to pixel control circuit 34 may be used, if desired.

Pixel control circuit 34 may include transistors for receiving and storing data signals from data line D in response to control signals on one or more horizontal control paths such as gate line(s) G. Pixel control circuit 34 may also include circuitry for applying a current proportional to the stored data bit on pixel 24 to light-emitting diode 32, so that light-emitting diode 32 emits a desired amount of light 36.

When manufacturing displays that have numerous rows and columns of pixels, there is a potential that a pixel circuit may be manufactured with a defect. A pixel circuit defect might, for example, cause a pixel to be stuck off (no current passing through diode 32) or stuck on (current passing through diode 32). Pixels that are stuck on emit light even in situations in which a black image is being displayed on display 14, causing these pixels to appear as bright visual defects on display 14.

To avoid undesirable visual artifacts on display 14, display 14 may contain redundant pixel control circuitry such as one or more lines of pixel control circuits 34 (e.g., one or more rows and/or columns of redundant pixel control circuits 34). If defective pixel control circuitry is detected during manufacturing, the redundant pixel control circuitry may be switched into use in place of the defective pixel control circuitry.

Figure 4:
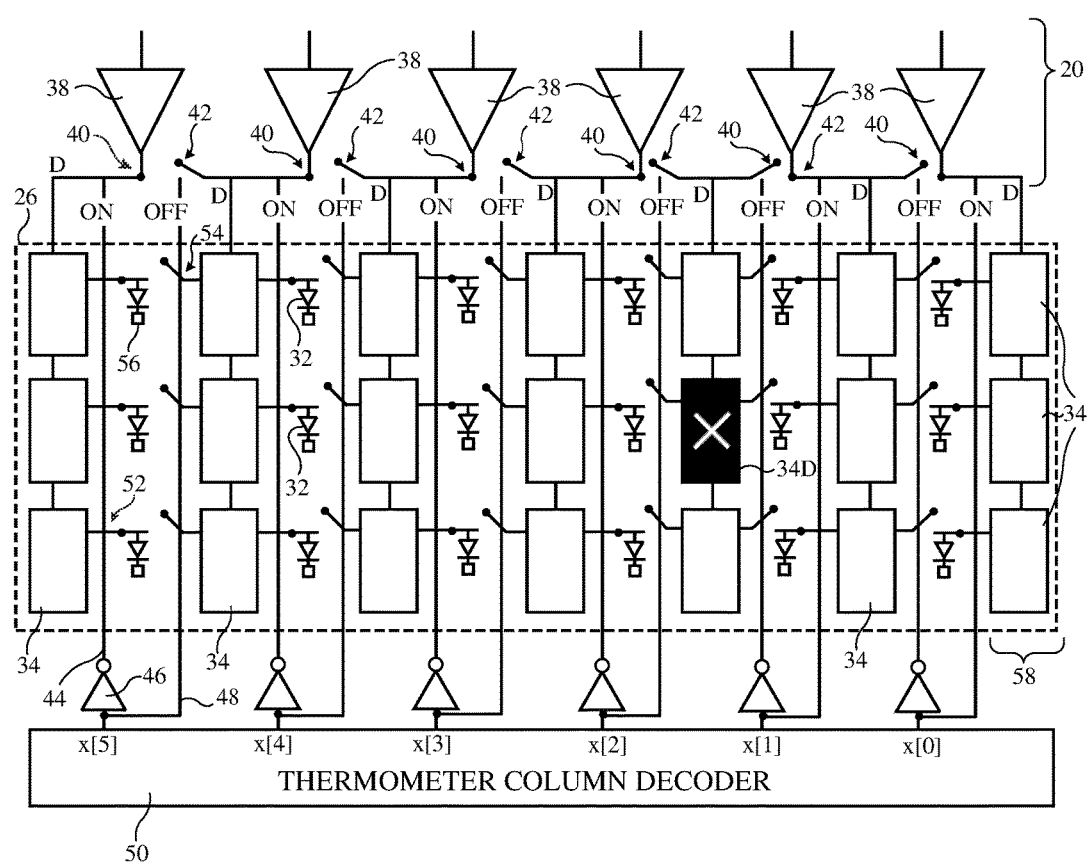
FIG. 4 is a diagram of an illustrative display with redundant circuitry in accordance with an embodiment.

Consider, as an example, display 14 of FIG. 4. As shown in FIG. 4, display 14 may include pixel array 26. Pixel array 26 (in the simplified example of FIG. 4) has three rows and six columns of light-emitting diodes 32. Pixel array 26 also has three rows and seven columns of pixel control circuits 34. The first six columns of pixel control circuits 34 (e.g., the leftmost six columns of FIG. 4), which may sometimes be referred to as regular pixel control circuits or normal pixel control circuits, may be used when pixel array 26 is defect free. In this situation, the seventh (rightmost) column of pixel control circuits 34 (column 58), which may sometimes be referred to as a column of redundant pixel control circuits, is not needed. When a column of the pixel control circuits in pixel array 26 contains a defect, however, the column of redundant pixel control circuits can be switched into use in place of the defective column. In this way, sufficient pixel control circuits may be made available for controlling light-emitting diodes 32 even in the presence of a pixel control circuit manufacturing defect.

Display 14 may include switching circuitry that can be configured during manufacturing (e.g., using configuration data in non-volatile memory in display 14). The switching circuitry can be configured to switch the normal pixel control circuitry or the redundant pixel control circuitry into use, as appropriate.

As shown in FIG. 4, display 14 may include display driver circuitry 20. Display driver circuitry 20 may include six column drivers 38 and switching circuitry such as switches 40 and 42. Each column of pixel control circuits 34 may have an associated data line D. In the present example, there are six regular (normal) data lines D and one redundant data line D associated with column 58 of redundant pixel control circuits 34. The output of each of the six column drivers 38 is coupled to a respective one of the regular data lines via a respective one of switches 40 and is coupled to a data line in a successive column via a respective one of switches 42. In this way, the last column driver 38 has an opportunity to be selectively coupled to the data line D in the redundant column (column 58) of pixel control circuits 34 when needed to accommodate a detected defect in a pixel control circuit 34 in array 26.

Each switch 40 may be turned on and off by control signals from a respective one of inverters 46 over a respective switch control line 44. Inverters 46 may be coupled to the outputs of column decoder 50 and may sometimes be referred to as inverter circuitry or column decoder circuitry. The output of the column driver 38 in each column is coupled to the data line in a successive column by a respective one of switches 42. Each switch 42 may be turned on and off by control signals received over a respective switch control line 48.

Thermometer column decoder 50 (e.g., circuitry in display driver circuitry 18) may have non-volatile memory cells (e.g., a row of cells that receive thermometer code configuration data). Each non-volatile memory cell may be loaded with a binary data bit during manufacturing. Once loaded, column decoder 50 may supply associated control signals on its outputs. For example, in the arrangement of FIG. 4 in which there are six normal columns of pixel control circuits 34, column decoder 50 may have six non-volatile memory cells that supply six corresponding control signals ($x[5] \ldots x[0]$) to six corresponding switch control lines 48.

Inverters 46 are used to invert the control bits on the outputs of column decoder 50, so that the control signals on lines 44 are complementary to the control signals on lines 48. As a result, when a given decoder output is a logic one (e.g., a high voltage level), the line 48 coupled to that output will carry a logic one and the line 44 coupled to the output of the associated inverter 46 will be a logic zero.

The switches 40 and 42 in each column form a column driver output switching circuit. Switches 42 are coupled to lines 48 and switches 40 are coupled to lines 44, so the states of switches 40 and 42 in the column driver output switching circuit of each column will be complementary to each other (e.g., in each column a respective switch 40 will be on while a respective switch 42 will be off or vice versa). In its first state (sometime referred to as a regular or normal state), this switching circuit routes data from the output of the column driver 38 in a given column into the pixel control circuits 34 in that column. In its second state (sometimes referred to as a bypass state), this switching circuit routes data from the output of the column driver 38 in a given column into the pixel control circuits 34 in a subsequent column (e.g., the adjacent column to the right in the example of FIG. 4). Multiple columns may be shifted in this way when needed to accommodate a defect. The switching circuitry formed by switches 40 and 42 therefore allows a column of pixel control circuits that contains a defect to be bypassed and allows redundant pixel control circuits to be switched into use in place of the bypassed defective pixel control circuits.

Each light-emitting diode 32 is coupled to a pixel control circuit 34 in the same column as that light-emitting diode by a respective switch 52 and is coupled to a pixel control circuit 34 in the subsequent column by a respective switch 54. When a column is free of defects, switches 52 in that column can be turned on and switches 54 in that column can be turned off by asserting the control signal on line 44 of that column (e.g., by taking line 44 high) and deasserting the control signal on line 48 of that column (e.g., by taking line 48 low). Pairs of switches 52 and 54 therefore form switching circuits that can be placed in a regular or bypass mode as needed to selectively bypass a column of pixel control circuits 34 that contains a defect.

In the example of FIG. 4, pixel control circuit 34D is defective. Accordingly, thermometer code configuration data (e.g., $x[5]=0$, $x[4]=0$, $x[3]=0$, $x[2]=0$, $x[1]=1$, and $x[0]=1$) can be loaded into the non-volatile memory of column decoder 50 during manufacturing. The thermometer code data contains all zeros for the initial (leftmost) defect-free columns and contains ones for the defective column and all subsequent columns (the columns where data is shifted). This causes decoder 50 to provide control signals on lines 44 and 46 that configure the switching circuitry of display 14 to bypass defective pixel control circuit 34D. In particular, the outputs of the leftmost four column drivers 38 are routed respectively to the leftmost four columns of pixel control circuits 34. The fifth column of pixel control circuits 34 (i.e., the column containing defective pixel control circuit 34D) is bypassed. The outputs of the rightmost two column drivers 38 are shifted to the rightmost two columns of pixel control circuits 34 (e.g., the last of the six columns of regular pixel control circuits 34 and the column of redundant pixel control circuits 34, respectively).

Figure 5:
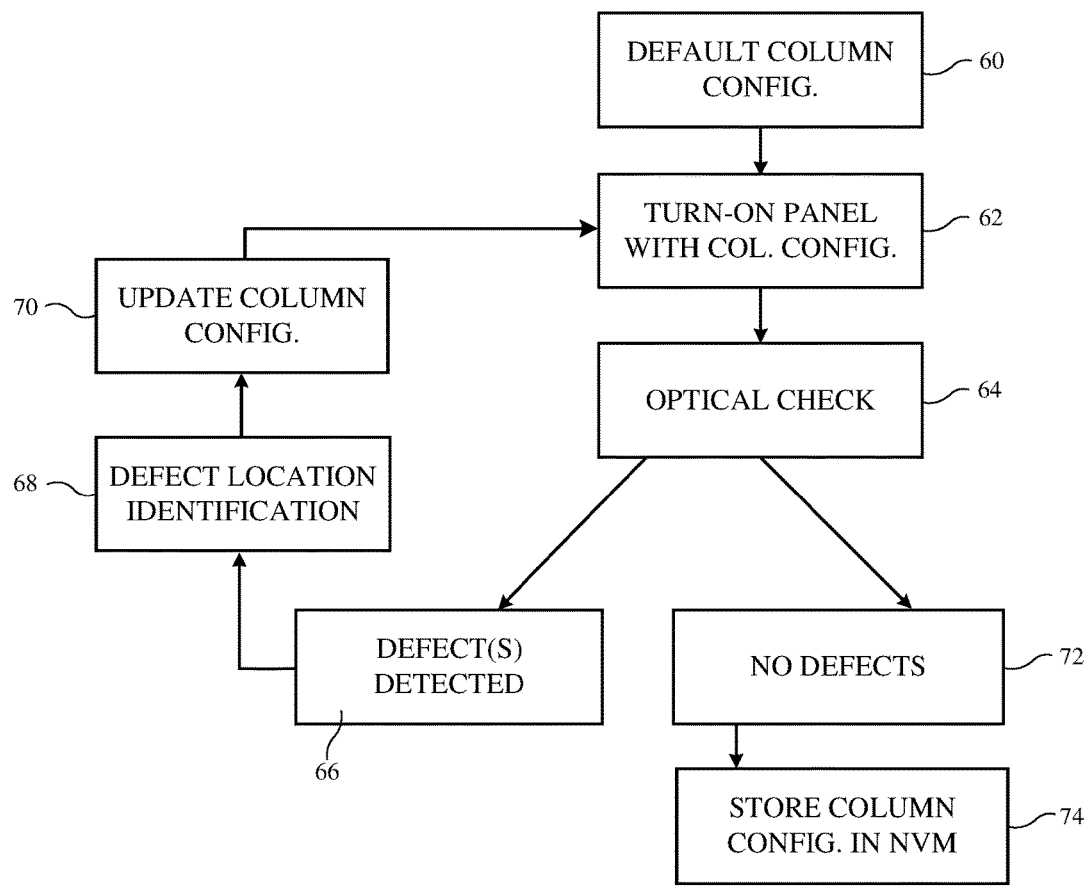
FIG. 5 is flow chart of illustrative operations involved in testing and configuring a display with redundant circuitry in accordance with an embodiment.

FIG. 5 is a flow chart of illustrative operations associated with configuring a display with redundant pixel control circuitry to accommodate defects. During the operations of FIG. 5, a tester may use a camera or other optical inspection equipment to monitor the output of display 14 and thereby determine if any pixels are defective (e.g., by detecting stuck on or stuck off pixels, etc.). The tester may supply test images to display driver circuitry 18 while the camera is monitoring the output of light-emitting diodes 32.

Initially (block 60), the tester or other equipment (e.g., non-volatile memory programing equipment) may load default configuration data into display driver circuitry 18 (e.g., decoder 50) that places the switching circuitry into its regular operating state. In its regular (default) column configuration, pixel control circuits 34 of redundant column 58 are switched out of use.

During the operations of block 62, display 14 may be turned on and loaded with a test image while pixel control circuits 34 are configured to operate in their default configuration.

During the operations of block 64, the camera or other monitoring device in the tester may be used to check pixel array 26 to determine whether any of light-emitting diodes 32 are emitting abnormal amounts of light. In response to detecting a column of pixel control circuits 34 that contain a defect (block 66), the tester can determine the location of the defective column (block 68) and can create an updated set of configuration data during the operations of block 70. For example, thermometer code configuration data or configuration data that is encoded using other encoding techniques may be generated and supplied to column decoder 50 to configure the redundancy switching circuitry of display 14 so that the defective column is bypassed, as described in connection with bypassing defect 34D of FIG. 4.

Once the defect has been bypassed, the optical checking operations of block 64 will indicate that display 14 is operating satisfactorily (e.g., no defects will be present at block 72). The configuration data associated with this satisfactory configuration for display 14 may then be retained in the non-volatile memory (NVM) of decoder 50 (block 74). Even if power is turned off to display 14, decoder 50 will retain the configuration data. This ensures that the switching circuitry of display 14 is configured so that defective circuitry is bypassed and display 14 operates satisfactorily during operation of device 10 by a user.

Figure 6:
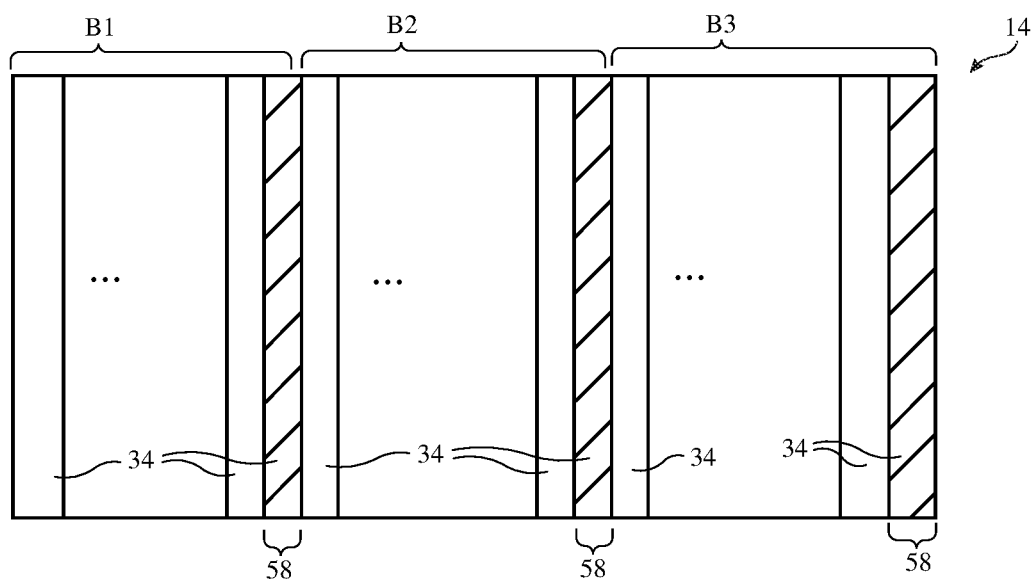
FIG. 6 is a diagram of an illustrative display containing multiple columns of redundant pixel control circuitry in accordance with an embodiment.

If desired, display 14 may be provided with multiple columns of redundant pixel control circuits 34. Display 14 may, as an example, be partitioned into multiple blocks such as blocks B1, B2, and B3 in the example of FIG. 6. Each block may have a respective column of redundant pixel control circuits 34, as indicated by redundant columns 58. Within each block, display 14 may have switching circuitry and column decoder circuitry such as switches 40, 42, 52, and 54 and circuits 46 and 50 of FIG. 4 to allow a column in that block that contains a defective pixel control circuit 34 to be bypassed. This type of arrangement allows a display with more than one defect to be repaired. For example, display 14 can be configured to operate satisfactorily even if a first defect is identified in block B1, a second defect is identified in block B2, and a third defect is identified in block B3. There may be any suitable number of blocks (partitions) and any suitable number of redundant pixel control circuits in display 14 (e.g., at least 5, at least 10, at least 50, fewer than 100, fewer than 20, fewer than 4, or other suitable number).

Figure 7:
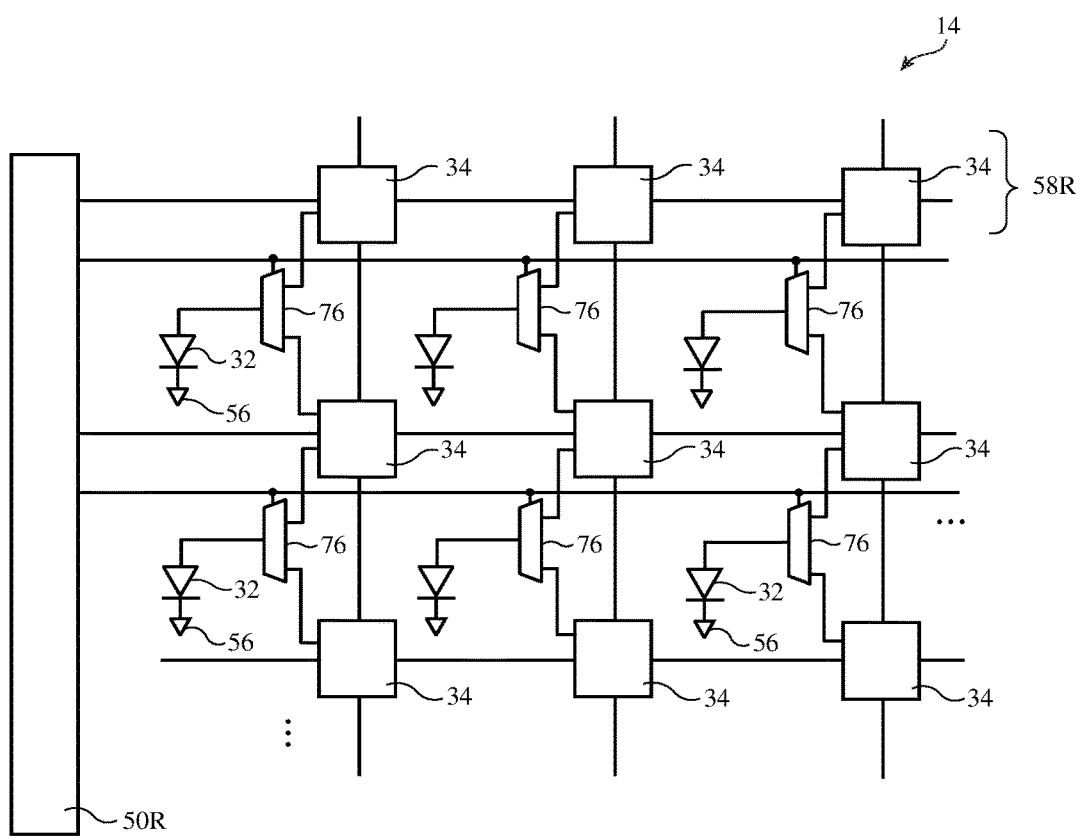
FIG. 7 is a diagram of an illustrative display with a row of redundant pixel control circuitry in accordance with an embodiment.

FIG. 7 shows how redundancy may be implemented using a row-wise shifting scheme. As shown in the example of FIG. 7, a redundant row 58R of pixel control circuits 34 may be provided in display 14. Thermometer row decoder 50R may be used in suppling control signals to switching circuits 76 (each of which may contain a first switch coupled to a pixel control circuit 34 in a given row and each of which may contain a second switch coupled to a pixel control circuit 34 in a subsequent row). In the absence of defects, switching circuitry such as switching circuits 76 can be configured to switch pixel control circuit 34 in non-redundant rows into use. These pixel control circuits 34 may then supplying control signals (drive currents based on loaded data) to respective light-emitting diodes 32 during operation of display 14. When a row containing a defective pixel control circuit 34 is identified during testing, switching circuitry such as switching circuits 76 can be configured so that the row of pixel control circuits containing the defective pixel circuit can be bypassed and redundant pixel control circuits 34 in redundant row 58R switched into use.

As these examples demonstrate, display 14 may be provided with redundancy circuitry that allows redundant pixel control circuitry to be switched into use to replace defective pixel control circuitry. The redundant pixel control circuitry may include one or more lines of redundant pixel control circuits. For example, horizontal strips (rows) of pixel control circuits can be provided in configurations of the type shown in FIG. 7 and/or vertical strips (columns) of pixel control circuits can be provide in configurations of the type shown in FIG. 5. Switching circuitry may be configured using control signals from decoder circuitry containing configuration data stored in non-volatile memory. The switching circuitry may include switches such as transistor-based switches. For example, each switch may be implemented using a respective n-channel metal-oxide-semiconductor transistor or other suitable transistor circuitry may be used in forming the switching circuitry for display 14.

The foregoing is merely illustrative and various modifications can be made to the described embodiments. The foregoing embodiments may be implemented individually or in any combination.

What is claimed is:

1. A display, comprising:
   a substrate;
   an array of light-emitting diodes on the substrate;
   display driver circuitry configured to supply image data to the array of light-emitting diodes on data lines and configured to supply control signals to the array of light-emitting diodes over control lines;
   switching circuitry;
   pixel control circuits coupled to the light-emitting diodes and the data lines by the switching circuitry, wherein the pixel control circuits include redundant pixel control circuits; and
   a decoder circuit having non-volatile memory operable to receive configuration data and provide corresponding control signals to the switching circuitry to configure the switching circuitry to bypass a defective pixel control circuit in the pixel control circuits and switch the redundant pixel control circuits into use.

2. The display defined in claim 1 wherein the decoder circuit comprises a thermometer code decoder circuit and wherein the switching circuitry includes first switches and second switches, wherein each light-emitting diode is coupled to a first respective pixel control circuit in the pixel control circuits by a respective one of the first switches and is coupled to a second respective pixel control circuit in the pixel control circuits by a respective one of the second switches.

3. The display defined in claim 2 wherein the display driver circuitry includes driver circuits, third switches, and fourth switches and wherein each driver circuit has an output that is coupled to a first respective data line in the data lines by a respective one of the third switches and is coupled to a second respective data line in the data lines by a respective one of the fourth switches.

4. The display defined in claim 3 wherein the driver circuits comprise column drivers, wherein the data lines are associated with columns of the pixel control circuits, wherein the redundant pixel control circuits are a column of redundant pixel control circuits, and wherein the thermometer code decoder circuit comprises a thermometer code column decoder.

5. The display defined in claim 4 further comprising inverters, first control lines, and second control lines, wherein the thermometer code decoder circuit has outputs each of which is coupled to a respective one of the second control lines and each of which is coupled by a respective one of the inverters to a respective one of the first control lines.

6. The display defined in claim 5 wherein the first control lines are coupled to the first switches.

7. The display defined in claim 6 wherein the second control lines are coupled to the second switches.

8. The display defined in claim 7 wherein the first control lines are coupled to the third switches.

9. The display defined in claim 8 wherein the second control lines are coupled to the fourth switches.

10. The display defined in claim 1 wherein the light-emitting diodes comprise organic light-emitting diodes.

11. The display defined in claim 1 wherein the light-emitting diodes are each formed in a respective crystalline semiconductor die.

12. The display defined in claim 1 wherein the substrate is a crystalline silicon substrate.

13. The display defined in claim 12 wherein the pixel control circuits are formed in the substrate.

14. The display defined in claim 1 wherein pixel control circuits include rows and columns of pixel control circuits, wherein each column of pixel control circuits is associated with a respective one of the data lines and wherein the redundant pixel control circuits are formed from one of the rows of pixel control circuits.

15. A display, comprising:
an array of light-emitting diodes configured to display images;
an array of pixel control circuits including a column of redundant pixel control circuits;
display driver circuitry configured to supply image data to columns of the pixel control circuits on data lines and configured to supply control signals to rows of the pixel control circuits on horizontal control lines;
switching circuitry configured to selectively couple each of the light-emitting diodes to two respective columns of the pixel control circuits; and
decoder circuitry configured to control the switching circuitry to switch the redundant column of pixel control circuits into use and bypass a column of the pixel control circuits that contains a defect.

16. The display defined in claim 15 wherein the column of redundant pixel control circuits is one of multiple columns of redundant pixel control circuits in the array of pixel control circuits and wherein the array of pixel control circuits includes multiple blocks of pixel control circuits each including a respective one of the multiple columns of redundant pixel control circuits.

17. The display defined in claim 15 wherein the decoder circuitry comprises thermometer code decoder circuitry having nonvolatile memory configured to store thermometer code data.

18. The display defined in claim 15 further comprising a crystalline silicon substrate on which the array of light-emitting diodes is formed, wherein at least some of the display driver circuitry is formed in the crystalline silicon substrate.

19. A display, comprising:
an array of light-emitting diodes configured to display images;
an array of pixel control circuits including a row of redundant pixel control circuits;
display driver circuitry configured to supply image data to columns of the pixel control circuits on data lines and configured to supply control signals to rows of the pixel control circuits on horizontal control lines;
switching circuitry configured to selectively couple each of the light-emitting diodes to two respective rows of the pixel control circuits; and
decoder circuitry configured to control the switching circuitry to switch the redundant row of pixel control circuits into use and bypass a row of the pixel control circuits containing a defect.

20. The display defined in claim 19 wherein the switching circuitry includes rows of switching circuits, each switching circuit coupled between a pixel control circuit in a first respective row of the pixel control circuits and a pixel control circuit in a second respective row of the pixel control circuits and wherein the decoder circuitry includes nonvolatile memory.

* * * * *